(12) United States Patent
Saive et al.

(10) Patent No.: US 10,700,234 B2
(45) Date of Patent: Jun. 30, 2020

(54) FABRICATION PROCESSES FOR EFFECTIVELY TRANSPARENT CONTACTS

(71) Applicant: California Institute of Technology, Pasadena, CA (US)

(72) Inventors: Rebecca Saive, Pasadena, CA (US); Harry A. Atwater, South Pasadena, CA (US); Sisir Yalamanchili, Pasadena, CA (US); Colton Bukowsky, Pasadena, CA (US); Thomas Russell, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 15/999,264

(22) Filed: Aug. 17, 2018

(65) Prior Publication Data
US 2019/0074401 A1    Mar. 7, 2019

Related U.S. Application Data

(60) Provisional application No. 62/546,746, filed on Aug. 17, 2017.

(51) Int. Cl.
*H01L 21/00* (2006.01)
*H01L 31/18* (2006.01)
*H01L 31/0224* (2006.01)

(52) U.S. Cl.
CPC .. *H01L 31/1884* (2013.01); *H01L 31/022425* (2013.01); *H01L 31/022466* (2013.01)

(58) Field of Classification Search
CPC ......... H01L 31/1884–1888; H01L 31/022425; H01L 31/022466; H01L 51/442–445;
(Continued)

(56) References Cited

U.S. PATENT DOCUMENTS

| 3,278,811 A | 10/1966 | Mori |
| 4,771,017 A | 9/1988 | Tobin et al. |

(Continued)

FOREIGN PATENT DOCUMENTS

| CN | 101598717 A | 12/2009 |
| WO | 2016111576 A1 | 7/2016 |

(Continued)

OTHER PUBLICATIONS

International Search Report and Written Opinion for International Application No. PCT/US2019/012916, Search completed May 3, 2019, dated May 7, 2019, 10 Pgs.
(Continued)

*Primary Examiner* — Calvin Y Choi
(74) *Attorney, Agent, or Firm* — KPPB LLP

(57) ABSTRACT

In conventional solar cells with metal contacts, a non-negligible fraction of the incoming solar power is immediately lost either through absorption or reflection upon interaction with the contacts. Effectively transparent contacts ("ETCs") for solar cells can be referred to as three-dimensional contacts designed to redirect incoming light onto a photoabsorbing surface of a solar cell. In many embodiments, the ETCs have triangular cross-sections. Such ETCs can be placed on a photoabsorbing surface such that at least one of their sides forms an angle with the photoabsorbing surface. In this configuration, the ETCs can redirect incident light onto the photoabsorbing surface, mitigating or eliminating reflection loss compared to conventional solar cells. When constructed in accordance with a number of embodiments of the invention, ETCs can be effectively transparent and highly conductive.

20 Claims, 10 Drawing Sheets

(58) Field of Classification Search
CPC ......... H01L 31/0352; H01L 31/035281; H01L 31/03529; H01L 31/0236–02366; H01L 21/0425–044; H01L 21/048–0495; H01L 21/12; H01L 21/28–2885; H01L 21/401; H01L 21/44–449; H01L 21/28587–28593; H01L 23/49838–49844; H01L 29/41–42396; H01L 21/28008–2885; H01L 23/4827–4828; H01L 23/49866–49894; H01L 29/43–518; H02S 40/30–38

See application file for complete search history.

(56) References Cited

U.S. PATENT DOCUMENTS

| | | | |
|---|---|---|---|
| 5,075,262 | A | 12/1991 | Nguyen et al. |
| 5,076,857 | A | 12/1991 | Nowlan |
| 5,122,215 | A | 6/1992 | Shibata et al. |
| 6,473,220 | B1 | 10/2002 | Clikeman et al. |
| 6,573,445 | B1 | 6/2003 | Burgers |
| 6,768,048 | B2 | 7/2004 | Woll et al. |
| 8,202,566 | B2 | 6/2012 | Davidson et al. |
| 9,750,141 | B2 | 8/2017 | Noy |
| 2003/0041894 | A1 | 3/2003 | Sverdrup, Jr. et al. |
| 2005/0109388 | A1 | 5/2005 | Murakami et al. |
| 2006/0283498 | A1 | 12/2006 | Gronet |
| 2007/0281099 | A1 | 12/2007 | Howarth et al. |
| 2008/0176030 | A1* | 7/2008 | Fonash ............... B82Y 20/00 428/119 |
| 2009/0061213 | A1 | 3/2009 | Bahnmuller et al. |
| 2009/0229667 | A1 | 9/2009 | Shrotriya et al. |
| 2010/0075261 | A1 | 3/2010 | Clevenger et al. |
| 2010/0089262 | A1 | 4/2010 | Seong et al. |
| 2010/0116316 | A1 | 5/2010 | Moslehi et al. |
| 2012/0067400 | A1 | 3/2012 | Derryberry et al. |
| 2013/0210185 | A1 | 8/2013 | Yoshimi et al. |
| 2014/0000692 | A1* | 1/2014 | Fogel ............. H01L 31/022425 136/256 |
| 2014/0130864 | A1 | 5/2014 | Lunt et al. |
| 2015/0311370 | A1 | 10/2015 | Chou et al. |
| 2016/0302305 | A1 | 10/2016 | Chang et al. |
| 2016/0313640 | A1* | 10/2016 | Cok ..................... C02F 1/4604 |
| 2016/0322514 | A1 | 11/2016 | Atwater et al. |
| 2017/0038047 | A1* | 2/2017 | Golle ..................... F21K 9/90 |
| 2017/0179041 | A1* | 6/2017 | Dias ..................... H01L 23/552 |
| 2017/0263796 | A1 | 9/2017 | Jahelka |
| 2018/0248064 | A1 | 8/2018 | Lunt et al. |
| 2019/0067504 | A1 | 2/2019 | Needell et al. |
| 2019/0148574 | A1 | 5/2019 | Saive et al. |

FOREIGN PATENT DOCUMENTS

| | | |
|---|---|---|
| WO | 2019035094 A1 | 2/2019 |
| WO | 2019099733 A1 | 5/2019 |
| WO | 2019139996 A1 | 7/2019 |

OTHER PUBLICATIONS

International Search Report and Written Opinion for International Application No. PCT/IB2018/056249, Search completed Nov. 8, 2018, dated Dec. 20, 2018, 14 Pgs.

International Search Report and Written Opinion for International Application No. PCT/US2018/061373, Search completed Mar. 6, 2019, dated Mar. 7, 2019, 10 Pgs.

"LCR-XP™ Data Sheet", Ulbrich Solar Technologies, Retrieved from: https://www.pvribbon.com/technology/lcr-xp-data-sheet/, 3 pgs.

Aberg et al., "A GaAs Nanowire Array Solar Cell With 15.3% Efficiency at 1 Sun", IEEE Journal of Photovoltaics, Oct. 14, 2015, vol. 6, No. 1, pp. 185-190, doi: 10.1109/JPHOTOV.2015.2484967.

Adams et al., "Are global wind power resource estimates overstated?", Environmental Research Letters, Feb. 25, 2013, vol. 8, No. 1, 15021, 9 pgs, doi: 10.1088/1748-9326/8/1/015021.

Afshinmanesh et al., "Transparent metallic fractal electrodes for semiconductor devices", Nano letters, Aug. 20, 2014, vol. 14, pp. 5068-5074.

Andrews et al., "The Effect of Spectral Albedo on Amorphous Silicon and Crystalline Silicon Solar Photovoltaic Device Performance", Solar Energy, vol. 91, Mar. 22, 2013, pp. 233-241.

Arora et al., "Perovskite solar cells with CuSCN hole extraction layers yield stabilized efficiencies greater than 20%", Science, Nov. 10, 2017, vol. 358, No. 6364, pp. 768-771, doi: 10.1126/science.aam5655.

Arvo, "Backward ray tracing", Developments in Ray Tracing, Computer Graphics, Proc. of ACM SIGGRAPH 86 Course Notes, 1986, pp. 259-263.

Baruch et al., "On some thermodynamic aspects of photovoltaic solar energy conversion", Solar Energy Materials and Solar Cells, vol. 36, No. 2, Feb. 1995, pp. 201-222.

Batchelder et al., "The Luminescent Solar Concentrator", Thesis, California Institute of Technology, 1982, 287 pgs.

Blakers, "Shading losses of solar-cell metal grids", Journal of Applied Physics, May 15, 1992, vol. 71, No. 10, pp. 5237-5241, published online Jun. 4, 1998.

Bomm et al., "Fabrication and spectroscopic studies on highly luminescent CdSe/CdS nanorod polymer composites", Beilstein Journal of Nanotechnology, vol. 1, No. 1, Nov. 29, 2010, pp. 94-100.

Brennan et al., "Effects of Spectral Albedo on Solar Photovoltaic Devices", Solar Energy Materials and Solar Cells, vol. 124, Feb. 19, 2014, pp. 111-116.

Bronstein et al., "Luminescent Solar Concentration with Semiconductor Nanorods and Transfer-Printed Micro-Silicon Solar Cells", ACS Nano, vol. 8, No. 1, Jan. 28, 2014, pp. 44-53.

Bronstein et al., "Quantum Dot Luminescent Concentrator Cavity Exhibiting 30-fold Concentration", ACS Phototonics, vol. 2, No. 11, Aug. 17, 2015, pp. 1576-1583.

Burgers, "How to Design Optimal Metallization Patterns for Solar Cells", Progress in Photovoltaics: Research and Applications, May 4, 1999, vol. 7, pp. 457-461, http://www.ecn.nl/docs/library/report/1999/rx99023.pdf.

Carlson et al., "Transfer printing techniques for materials assembly and micro/nanodevice fabrication", Advanced Materials, vol. 24, No. 39, Oct. 9, 2012, Electronic Publication: Aug. 31, 2012, pp. 5284-5318.

Chen et al., "Compact high-quality CdSe-CdS core-shell nanocrystals with narrow emission linewidths and suppressed blinking", NIH Public Access: Author Manuscript, May 2014, 14 pgs, Published as: Nature Materials, vol. 12, No. 5, May 2013, Electronic Publication: Feb. 3, 2013, pp. 445-451.

Chen et al., "Increasing light capture in silicon solar cells with encapsulants incorporating air prisms to reduce metallic contact losses", Optics Express, vol. 24, No. 22, Oct. 31, 2016, published Sep. 30, 2016, 12 pgs.

Coropceanu et al., "Core/shell quantum dot based luminescent solar concentrators with reduced reabsorption and enhanced efficiency", Nano Letters, vol. 14, No. 7, Jul. 9, 2014, Electronic Publication: Jun. 6, 2014, pp. 4097-4101.

Cuevas et al., "50 Per cent more output power from an albedo-collecting flat panel using bifacial solar cells", Solar Energy, vol. 29, No. 5, 1982, pp. 419-420.

De Souza et al., "Inversion mode n-channel GaAs field effect transistor with high-k/metal gate", Applied Physics Letters, Apr. 16, 2008, vol. 92, No. 15, pp. 153508-1-153508-2, https://doi.org/10.1063/1.2912027.

Debije et al., "Thirty Years of Luminescent Solar Concentrator Research: Solar Energy for the Built Environment", Advanced Energy Materials, vol. 2, No. 1, 2012, pp. 12-35.

Deline et al., "Evaluation and Field Assessment of Bifacial Photovoltaic Module Power Rating Methodologies", IEEE 43rd Photovoltaic Specialists Conference (PVSC), Portland, Oregon, Jun. 5-10, 2016, 6 pgs.

Divitt et al., "Spatial coherence of sunlight and its implications for light management in photovoltaics", Optica, Jan. 27, 2015, vol. 2, No. 2, pp. 95103, doi: 10.1364/Optica.2.000095.

(56) References Cited

OTHER PUBLICATIONS

Ellmer, "Past achievements and future challenges in the development of optically transparent electrodes", Nature Photonics, Nov. 30, 2012, vol. 6, pp. 809-817.

Essig et al., "Mechanically stacked 4-terminal III-V/Si tandem solar cells", Conference paper, Jun. 2017, 2 pgs.

Essig et al., "Realization of GaInP/Si dual-junction solar cells with 29.8% one-sun efficiency", IEEE Journal of Photovoltaics, vol. 6, No. 4, Jul. 2016, Date of Publication: Apr. 27, 2016, 7 pgs.

Feldmann et al., "Carrier-selective contacts for Si solar cells", Applied Physics Letters, vol. 104, No. 18, May 8, 2014, pp. 181105-1-181105-4.

Ferry et al., "Light trapping in ultrathin plasmonic solar cells", Optics Express, Jun. 24, 2010, vol. 18, pp. A237-A245.

Fertig et al., "Bifacial potential of single- and double-sided collecting silicon solar cells", Progress in Photovoltaics: Research and Applications, vol. 24, No. 6, Jan. 13, 2016, pp. 818-829.

Fertig et al., "Economic feasibility of bifacial silicon solar cells", Progress in Photovoltaics: Research and Applications, vol. 24, No. 6, Jan. 14, 2016, pp. 800-817.

Fraunhofer, "Photovoltaics Report", Fraunhofer ISE, Freiburg, 2014, 44 pgs.

Gallagher et al., "Quantum dot solar concentrator behaviour, predicted using a ray trace approach", International Journal of Ambient Energy, vol. 25, No. 1, Jan. 2004, pp. 47-56.

Gangopadhyay et al., "Front Grid Design For Plated Contact Solar Cells", IEEE, 399-402, 2002.

Geisz et al., "Enhanced external radiative efficiency for 20.8% efficient single-junction GaInP solar cells", Applied Physical Letters, vol. 103, No. 4, Jul. 25, 2013, pp. 041118-1-041118-5.

Goetzberger et al., "Solar Energy Conversion with Fluorescent Collectors", Applied Physics, vol. 14, No. 2, Oct. 1977, pp. 123-129.

Goldschmidt et al., "Increasing the efficiency of fluorescent concentrator systems", Solar Energy Materials and Solar Cells, vol. 93, No. 2, Feb. 2009, pp. 176-182, available online Nov. 20, 2008.

Goncharov et al., "Reconstruction of the optical system of the human eye with reverse ray-tracing", Optics express, Feb. 4, 2008, vol. 16, No. 3, pp. 1692-1703.

Green, "Self-consistent optical parameters of intrinsic silicon at 300 K including temperature coefficients", Solar Energy Materials and Solar Cells, vol. 92, No. 11, Nov. 2008, pp. 1305-1310.

Guerrero-Lemus et al., "Bifacial solar photovoltaics—A technology review", Renewable and Sustainable Energy Reviews, Mar. 8, 2016, vol. 60, pp. 1533-1549.

Guo et al., "Vertically mounted bifacial photovoltaic modules: A global analysis", Energy, vol. 61, Nov. 1, 2013, pp. 447-454, available online Sep. 23, 2013.

Gutmann et al., "Predicting the performance of photonic luminescent solar concentrators", IEEE Photovoltaic Specialists Conference, Jun. 16-21, 2013, pp. 1864-1868.

Hansen et al., "Analysis of Irradiance Models for Bifacial PV Modules", IEEE 43rd Photovoltaic Specialists Conference (PVSC), Portland, Oregon, Jun. 5-10, 2016, 6 pgs.

Henry et al., "Alumina etch masks for fabrication of high-aspect-ratio silicon micropillars and nanopillars", Nanotechnology, Jun. 2, 2009, vol. 20, 255305, 4 pgs.

Henry, "ICP etching of silicon for micro and nanoscale devices", Thesis, California Institute of Technology, May 19, 2010, 219 pgs., (presented in two parts).

Herasimenka et al., "> 750 mV open circuit voltage measured on 50 μm thick silicon heterojunction solar cell", Applied Physics Letters, Aug. 1, 2013, vol. 103, pp. 053511-1-053511-4.

Hinkle et al., "Detection of Ga suboxides and their impact on III-V passivation and Fermi-level pinning", Applied Physics Letters, Apr. 20, 2009, vol. 94, No. 16, pp. 162101-1-162101-3, doi: 10.1063/1.3120546.

Saive et al., "Light Trapping in Bifacial Solar Modules Using Effectively Transparent Contacts (ETCs)", 45th IEEE Photovoltaic Specialist Conference, Aug. 2018, 3 pgs.

Saive et al., "Mesoscale trumps nanoscale: metallic mesoscale contact morphology for improved light trapping, optical absorption and grid conductance in silicon solar cells", Optics Express, vol. 26, No. 6, Mar. 19, 2018, 8 pgs.

Saive et al., "Three-dimensional nanoimprint lithography using two-photon lithography master samples", ArVix, Feb. 2017, 4 pgs.

Saive et al., "Transparent, Conductive and Lightweight Superstrates for Perovskite Solar Cells and Modules", 45th IEEE Photovoltaic Specialist Conference, Aug. 2018, 5 pgs.

Sanyo Energy Corp, "Bifacial Photovoltaic Module", Hit photovoltaic module double, Jan. 9, 2008, 2 pgs.

Sark et al., "Luminescent Solar Concentrators: The route to 10% efficiency", IEEE Photovoltaic Specialist Conference, Jun. 8-13, 2014, pp. 2276-2278.

Schneider et al., "Solar Cell Efficiency Improvement by New Metallization Techniques—the Day4 Electrode Concept", Proceedings of the IEEE 4th World Conference on Photovoltaic Energy Conference, Waikoloa, Hawaii, May 7-12, 2006, 4 pgs.

Sheldon et al., "Evaluation of ITO/GaAs solar cells", Journal of Vacuum Science and Technology, 1982, vol. 20, No. 3, pp. 410-413, doi: 10.1116/1.571479.

Shockley et al., "Detailed Balance Limit of Efficiency of p-n Junction Solar Cells", Journal of Applied Physics, vol. 32, No. 3, Mar. 1961, pp. 510-519.

Sholin et al., "Semiconducting polymers and quantum dots in luminescent solar concentrators for solar energy harvesting", Journal of Applied Physics, vol. 101, No. 12, Jun. 28, 2007, pp. 123114-1-123114-9.

Slooff et al., "A Luminescent Solar Concentrator with 7.1% power conversion efficiency", Phys. Status Solid—Rapid Res. Letter, vol. 2, No. 6, 2008, pp. 257-259, published online Sep. 6, 2008.

Soderstrom et al., "Smart Wire Connection Technology", 28th European Photovoltaic Solar Energy Conference and Exhibition, Session 1CV.2.17, 2013, pp. 495-499.

Soderstrom et al., "Smart Wire Connection Technology", Meyer Burger, Retrieved from: https://www.meyerburger.com/user_upload/dashboard_news_bundle/376409e022f7d2ae6f6e29318f8055410774c7fd.pdf, 12 pgs.

Soria et al., "A study of the annual performance of bifacial photovoltaic modules in the case of vertical facade integration", Energy Science & Engineering, vol. 4, No. 1, Nov. 26, 2015, pp. 52-68.

Sze et al., "Physics of semiconductor devices", Hoboken, NJ, Wiley-Interscience, 2007, 763 pgs. (presented in three parts).

Taguchi et al., "24.7% record efficiency Hit solar cell on thin silicon wafer", IEEE Journal of Photovoltaics, Jan. 2014, vol. 4, pp. 96-99.

Unknown Author, "Bright Green Tree—Waikato", https://commons.wikimedia.org/wiki/File:Bright_green_tree_-_Waikato.jpg, 2005, 2 pgs.

Valdivia et al., "Bifacial Photovoltaic Module Energy Yield Calculation and Analysis", IEEE PVSC 2017 Conference Proceedings, 2017, pp. 1094-1099.

Van Dam et al., "High-Efficiency Nanowire Solar Cells with Omnidirectionally Enhanced Absorption Due to Self-Aligned Indium—Tin—Oxide Mie Scatterers", ACS Nano, Nov. 29, 2016, vol. 10, No. 12, pp. 11414-11419, doi: 10.1021/acsnano.6b06874.

Van De Groep et al., "Transparent Conducting Silver Nanowire Networks", Nano Letters, May 3, 2012, vol. 12, pp. 3138-3144, doi:10.1021/nl301045a.

Vest et al., "Levelized Cost and Levelized Avoided Cost of New Generation Resources in the Annual Energy Outlook 2016", U.S. Energy Information Administration, Aug. 2016, 20 pgs.

Vogt, "Development of Physical Models for the Simulation of Optical Properties of Solar Cell Modules", Hannover, Leibniz Information Centre for Science and Technology University Library, Thesis, 2015, 161 pgs.

Vogt et al., "Measurement of the Optical Constants of Soda-Lime Glasses in Dependence of Iron Content and Modeling of Iron-Related Power Losses in Crystalline Si Solar Cell Modules", IEEE Journal of Photovoltaics, vol. 6, No. 1, Nov. 19, 2015, pp. 111-118.

Vogt et al., "Optical Constants of UV Transparent EVA and the Impact on the PV Module Output Power under Realistic Irradiation", Energy Procedia, vol. 92, Aug. 2016, pp. 523-530.

(56) References Cited

OTHER PUBLICATIONS

Wallentin et al., "InP Nanowire Array Solar Cells Achieving 13.8% Efficiency by Exceeding the Ray Optics Limit", Science, Mar. 1, 2013, vol. 339, No. 6123, pp. 1057-1060, doi: 10.1126/science.1230969.
Wang et al., "Image quality assessment: from error visibility to structural similarity", IEEE transactions on image processing, Apr. 2004, vol. 13, No. 4, pp. 600-612.
Ward et al., "High aspect ratio electrodeposited Ni/Au contacts for GaAs-based III-V concentrator solar cells", Progress in Photovoltaics: Research and Applications, No. 23, 2015, Published online Mar. 20, 2014, pp. 646-653.
Wheeler et al., "Switchable Photovoltaic Windows Enabled by Reversible Photothermal Complex Dissociate from Methylammonium Lead Iodide", Nature Communications, vol. 8, No. 1722, 2017, pp. 1-9.
Wittwer et al., "Fluorescent Planar Concentrators", Solar Energy Materials and Solar Cells, vol. 11, No. 3, 1984, pp. 187-197.
Woodhouse et al., "A Manufacturing Cost Analysis Relevant to Single- and Dual-Junction Photovoltaic Cells Fabricated with III-Vs and III-Vs Grown on Czochralski Silicon", National Renewable Energy Lab, Sep. 30, 2013, 92 pgs.
Wurfel et al., "Charge Carrier Separation in Solar Cells", IEEE Journal of Photovoltaics, Nov. 20, 2014, vol. 5, No. 1, pp. 461-469, doi: 10.1109/JPHOTOV.2014.2363550.
Xie et al., "InAs/InP/ZnSe core.shell/shell quantum dots as near-infrared emitters: Bright, narrow-band, non-cadium containing, and biocompatible", Nano Research, vol. 1, No. 6, 2008, pp. 457-464.
Yablonovitch, "Statistical ray optics", Journal of the Optical Society of America, vol. 72, No. 7, Jul. 1982, pp. 899-907.
Yablonovitch, "Thermodynamics of the fluorescent planar concentrator", Journal of the Optical Society of America, vol. 70, No. 11, Nov. 1980, pp. 1362-1363.
Yin et al., "19.2% Efficient InP Heterojunction Solar Cell with Electron-Selective TiO2 Contact", ACS Photonics, Sep. 25, 2014, vol. 1, No. 12, pp. 1245-1250, doi: 10.1021/ph500153c.
Yu et al., "Selecting tandem partners for silicon solar cells", Nature Energy, Nov. 2016, vol. 1, No. 11, Article 16137, pp. 1-4, published Sep. 26, 2016, doi: 10.1038/nenergy.2016.137.
Yusufoglu et al., "Analysis of the Annual Performance of Bifacial Modules and Optimization Methods", IEEE Journal of Photovoltaics, vol. 5, No. 1, Nov. 20, 2014, pp. 320-328.
Zheng et al., "Graphene oxide-based transparent conductive films", Progress in Materials Science, Mar. 25, 2014, vol. 64, pp. 200-247.
Zhou et al., "Near Infrared, Highly Efficient Luminescent Solar Concentrators", Advanced Energy Materials, vol. 6, No. 11, Jun. 8, 2016, pp. 1-8.
Holman et al., "Current losses at the front of silicon heterojunction solar cells", IEEE Journal of Photovoltaics, Jan. 2012, vol. 2, No. 1, pp. 7-15.
Honsberg et al., PVCDROM, http://pveducation.org/pvcdrom, Jan. 5, 2015, 1 pg.
Horzel et al., "Advantages of a new metallisation structure for the front side of solar cells", 13th European Photovoltaic Solar Energy Conference, Oct. 23-27, 1995, pp. 1368-1373.
Hoye et al., "Strongly Enhanced Photovoltaic Performance and Defect Physics of Air-Stable Bismuth Oxyiodide (BiOI)", Advanced Materials, Jul. 17, 2017, vol. 29, No. 36, 1702176, 10 pgs., doi: 10.1002/adma.201702176.
Hsu et al., "Performance enhancement of metal nanowire transparent conducting electrodes by mesoscale metal wires", Nature Communications, Sep. 25, 2013, vol. 4, No. 2522, pp. 1-7.
Hu et al., "Ray-trace simulation of CuInS(Se)_2 quantum dot based luminescent solar concentrators", Optics Express, vol. 23, No. 15, Jul. 27, 2015, pp. A858-A867.
Huang et al., "Fabrication of Silicon Nanowire Arrays with Controlled Diameter, Length, and Density", Advanced Materials, Feb. 7, 2007, vol. 19, No. 5, pp. 744-748, doi: 10.1002/adma.200600892.

Jasieniak et al., "Re-examination of the Size-Dependent Absorption Properties of CdSe Quantum Dots", Journal of Physical Chemistry, vol. 113, No. 45, Oct. 15, 2009, pp. 19468-19474.
Jiang et al., "Enhanced electron extraction using SnO2 for highefficiency planar-structure HC(NH2)2PbI3-based perovskite solar cells", Nature Energy, Nov. 14, 2016, vol. 2, Issue 16177, 7 pgs., doi: 10.1038/nenergy.2016.177.
Kelzenberg, "Silicon microwire photovoltaics", Thesis, California Institute of Technology, May 19, 2010, 324 pgs., (presented in two parts).
Kik et al., "Catoptric electrodes: transparent metal electrodes using shaped surfaces", Optics Letters, vol. 39, No. 17, Sep. 1, 2014, pp. 5114-5117.
King, "Photovoltaic Module and Array Performance Characterization Methods for All System Operating Conditions", AIP Conference Proceedings, vol. 394, No. 1, May 12, 2008, 22 pgs.
Klein et al., "Transparent Conductive Adhesives for Tandem Solar Cells Using Polymer—Particle Composites", ACS Applied Materials & Interfaces, 2008, No. 10, pp. 8086-8091.
Kopecek et al., "Bifaciality: One small step for technology, one giant leap for kWh cost reduction", Photovoltaics International, vol. 26, 2014, 11 pgs.
Kreinin et al., "PV systems based on bifacial modules: Performance simulation vs. design factors", IEEE 43rd Photovoltaic Specialists Conference (PVSC), Portland, Oregon, Jun. 5-10, 2016, pp. 2688-2691.
Krenzinger et al., "Estimation of Radiation Incident on Bifacial Albedo-Collecting Panels", International Journal of Solar Energy, vol. 4, No. 5, 1986, pp. 297-319.
Kuang et al., "A New Architecture for Transparent Electrodes: Relieving the Trade-Off Between Electrical Conductivity and Optical Transmittance", Advanced Materials, No. 23, 2011, pp. 2469-2473.
Lai et al., "Schottky Barrier Catalysis Mechanism in Metal-Assisted Chemical Etching of Silicon", ACS Applied Materials & Interfaces, Mar. 28, 2016, vol. 8, No. 14, pp. 8875-8879. doi: 10.1021/acsami.6b01020.
Levy et al., "Rapid and precise calculations of energy and particle flux for detailed-balance photovoltaic applications", Solid-State Electronics, vol. 50, No. 7-8, Jul.-Aug. 2006, pp. 1400-1405.
Lo et al., "New integrated simulation tool for the optimum design of bifacial solar panel with reflectors on a specific site", Renewable Energy, vol. 81, Sep. 2015, pp. 293-307.
Lohmuller et al., "The HIP-MWT+ solar cell concept on n-type silicon and metallization-induced voltage losses", 29th European PV Solar Energy Conference and Exhibition, Amsterdam, The Netherlands, Sep. 22-26, 2014, 7 pgs.
Lossen et al., "Double Printing nPERT Cells with Narrow Contact Layers", Energy Procedia, vol. 92, Aug. 2016, pp. 939-948.
Ma et al., "Enhancement of photovoltaic cell response due to high-refractive-index encapsulants", Journal of Applied Physics, Aug. 18, 2010, vol. 108, pp. 043102-1-043102-3, http://www.ecse.rpiscrews.us/~schubert/Reprints/2010-Ma-Ming-et-al-%28JAP%29-Enhancement-of-photovoltaic-cell-response-due-to-high-refractive-index-encapsulants.pdf.
Madrid et al., "Investigation of the Efficiency Boost Due to Spectral Concentration in a Quantum-Dot Based Luminescent Concentrator", IEEE World Conference on Photovoltaic Energy Conference, May 7-12, 2006, pp. 154-157.
Martinez et al., "Design, fabrication, and characterization of a luminescent solar concentrator with optimized optical concentration through minimization of optical losses", Journal of Photonics for Energy, vol. 6, No. 4, Nov. 30, 2016, pp. 045504-1-045501-11.
Masuko et al., "Achievement of more than 25% conversion efficiency with crystalline silicon heterojunction solar cell", IEEE Journal of Photovoltaics, Nov. 2014, vol. 4, pp. 1433-1435.
McIntosh et al., "OPAL 2: Rapid Optical Simulation of Silicon Solar Cells", 38th IEEE Photovoltaic Specialists Conference, Austin, Texas, Jun. 3-8, 2012, 8 pgs.
Meinardi et al., "Highly efficient luminescent solar concentrators based on earth-abundant indirect-bandgap silicon quantum dots", Nature Photonics, vol. 11, No. 3, Mar. 1, 2017, pp. 177-185.

(56) References Cited

OTHER PUBLICATIONS

Meinardi et al., "Large-area luminescent solar concentrators based on 'Stokes-shift-engineered' nanocrystals in a mass-polymerized PMMA matrix", Nature Photonics, vol. 8, No. 5, Apr. 13, 2014, pp. 392-399.
Mittag et al., "Triangular Ribbons for Improved Module Efficiency", 32nd European PV Solar Energy Conference and Exhibition, Jun. 20-24, 2016, Munich, Germany, 4 pgs.
Morales-Masis et al., "Transparent electrodes for efficient optoelectronics", Advanced Electronic Materials 3, No. 5 (2017): 1600529, 17 pgs.
Myers et al., "Visual appearance of microcontacts for solar windows", Journal of Photonics for Energy, vol. 9, No. 2, May 13, 2019, 10 pgs.
Narasimhan et al., "Hybrid Metal—Semiconductor Nanostructure for Ultrahigh Optical Absorption and Low Electrical Resistance at Optoelectronic Interfaces", ACS Nano, vol. 9, No. 11, Oct. 8, 2015, pp. 10590-10597.
Needell et al., "Micro-optical Tandem Luminescent Solar Concentrators", arXiv:1710.00034v1, Sep. 5, 2017, 10 pgs.
Niu et al., "High order diffraction suppression by quasi-periodic two-dimensional gratings", Optical Materials Express, Feb. 1, 2017, vol. 7, No. 2, pp. 366-375, doi: 10.1364/OME.7.000366.
Padmanabhan et al., "Light-induced degradation and regeneration of multicrystalline silicon AI-BSF and PERC solar cells", Physica Status Solidi: Rapid Research Letters, vol. 10, No. 12, Dec. 2016, Online Publication: Nov. 16, 2016, pp. 874-881.
Papakonstantinou et al., "Fundamental limits of concentration in luminescent solar concentrators revised: the effect of reabsorption and nonunity quantum yield", Optica, vol. 2, No. 10, Oct. 2015, pp. 841-849.
Papet et al., "19% Efficiency Module Based on Roth&Rau Heterojunction Solar Cells and Day4™ Energy Module Concept", 26th European Photovoltaic Solar Energy Conference and Exhibition, Session 4AV.1.13, 2011, pp. 33363339.
Powell et al., "The capital intensity of photovoltaics manufacturing: barrier to scale and opportunity for innovation", Energy & Environmental Science, 2015, vol. 8, No. 12, pp. 3395-3408, doi: 10.1039/C5EE01509J.
Rahman et al., "Efficient tool flow for 3D photovoltaic modelling", Computer Physics Communications, Mar. 30, 2015, vol. 193, pp. 124-130, doi: 10.1016/j.cpc.2015.03.016.
Rau et al., "Thermodynamics of light management in photovoltaic devices", Physical Review B, vol. 90, No. 3, Jul. 15, 2014, pp. 035211-1-035211-16.
Ravikumar, "Photovoltaic Capacity Additions: The optimal rate of deployment with sensitivity to time-based GHG emissions", Masters Thesis, Dec. 2013, Arizona State University, 50 pgs.
Richards et al., "Overcoming the Poor Short Wavelength Spectral Response of CdS/CdTe Photovoltaic Modules via Luminescence Down-Shifting: Ray-Tracing Simulations", Progress in Photovoltaics, vol. 15, No. 1, Jan. 2007, pp. 27-34, published online Sep. 20, 2006.
Rodriguez, "Bifacial solar cells—the two sides of the story", Solar Choice News, New Technologies May 5, 2015, Retrieved from: https://www.solarchoice.net.au/blog/news/bifacial-solar-cells-the-two-sides-of-the-story-050515, 7 pgs.
Romer et al., "Ion Implantation for Poly-Si Passivated Back-Junction Back-Contacted Solar Cells", IEEE Journal of Photovoltaics, vol. 5, No. 2, Mar. 2015, pp. 507-514.
Rowan et al., "Advanced Material Concepts for Luminescent Solar Concentrators", IEEE Journal of Selected Topics in Quantum Electronics, vol. 14, No. 5, Nov. 2008, pp. 1312-1322.
Rowell et al., "Transparent electrode requirements for thin film solar cell modules", Energy & Environmental Science, 2011, vol. 4, pp. 131-134.
Russell et al., "The Influence of Spectral Albedo on Bifacial Solar Cells: A Theoretical and Experimental Study", IEEE Journal of Photovoltaics, vol. 7, No. 6, Nov. 2017, pp. 1611-1618.
Sahin et al., "Monte-Carlo simulation of light propagation in luminescent solar concentrators based on semiconductor nanoparticles", Journal of Applied Physics, vol. 110, No. 3, Aug. 11, 2011, pp. 03108-1-033108-8.
Saive et al., "Effectively transparent front contacts for optoelectronic devices", Advanced Optical Materials, Jun. 10, 2016, vol. 4, No. 10, pp. 1470-1474, doi: 10.1002/adom.201600252.
Saive et al., "Enhancing the Power Output of Bifacial Solar Modules by Applying Effectively Transparent Contacts (ETCs) Wth Light Trapping", IEEE Journal of Photovoltaics, Sep. 2018, vol. 8, No. 5, pp. 1183-1189.
Saive et al., "Silicon heterojunction solar cells with effectively transparent front contacts", Sustainable Energy & Fuels, 2017, vol. 1, pp. 593-598.
Saive et al., "Effectively Transparent Contacts (ETCs) for Solar Cells", IEEE 43rd Photovoltaic Specialists Conference, Date of Conference: Jun. 5-10, 2016, Portland, Oregon, 4 pgs.
Saive et al., "Enhanced Light Trapping in Thin Silicon Solar Cells using Effectively Transparent Contacts (ETCs)", 44th IEEE Photovoltaic Specialist.Conferences, Aug. 2017, 5 pgs.

\* cited by examiner

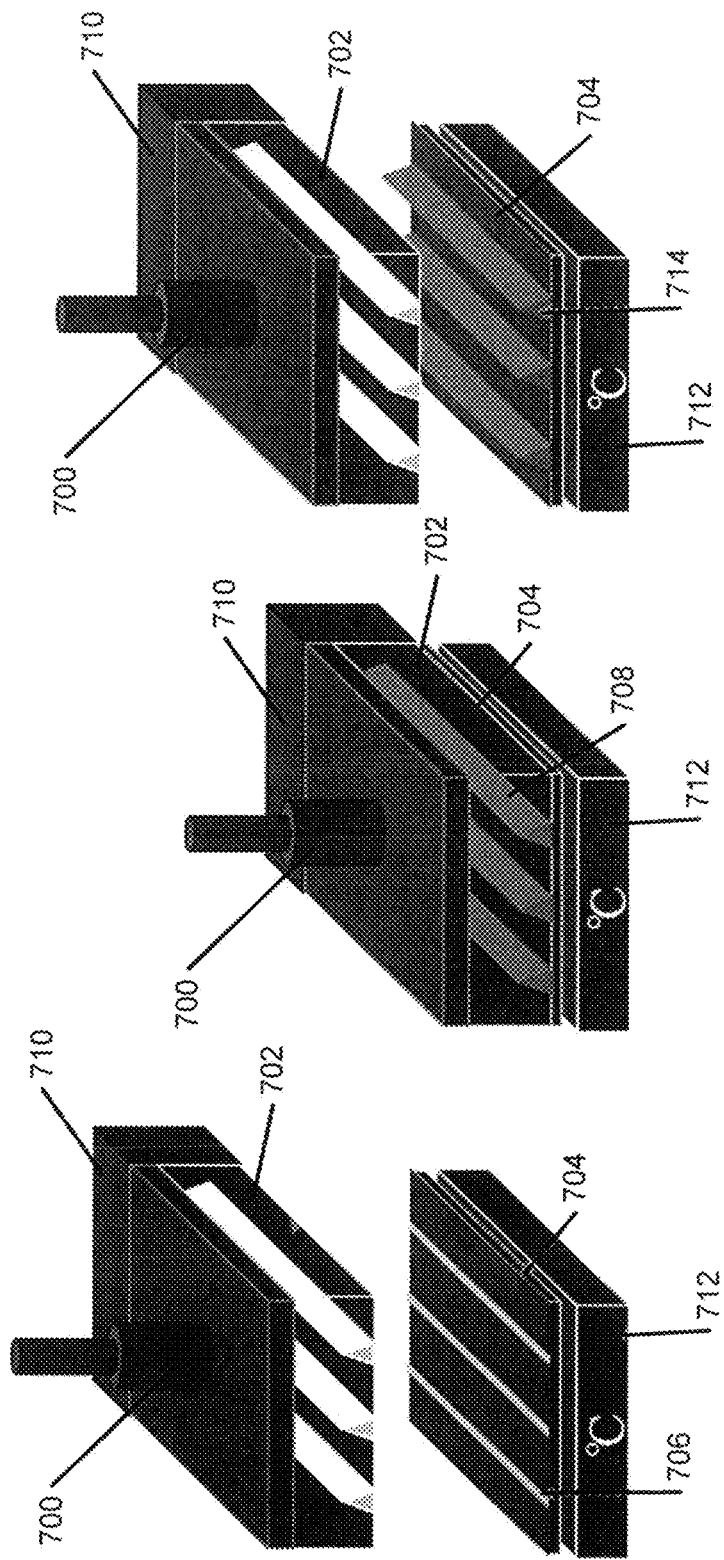

FABRICATION PROCESSES FOR EFFECTIVELY TRANSPARENT CONTACTS

CROSS-REFERENCE TO RELATED APPLICATIONS

The current application claims the benefit of and priority under 35 U.S.C. § 119(e) to U.S. Provisional Patent Application No. 62/546,746 entitled "Fabrication Processes for Effectively Transparent Contacts," filed Aug. 17, 2017. The disclosure of U.S. Provisional Patent Application No. 62/546,746 is hereby incorporated by reference in its entirety for all purposes.

STATEMENT REGARDING FEDERALLY SPONSORED RESEARCH OR DEVELOPMENT

This invention was made with government support under Grant No. DE-EE0004946/T-113750 awarded by the Department of Energy and Grant No. EEC1041895 awarded by the National Science Foundation. The government has certain rights in the invention.

FIELD OF THE INVENTION

The present invention generally relates to fabrication processes for contacts for solar cells and, more specifically, to effectively transparent contacts.

BACKGROUND

Photovoltaics refer to a class of methods for converting light into electricity using the photovoltaic effect. Due to technological advances in recent years, photovoltaics are becoming a more viable, carbon-free source of electricity generation. A photovoltaic system typically employs an array of solar cells to generate electrical power. Solar cells can be made of a variety of semiconductors, typically a silicon based structure, acting as a substrate and can include front and rear contacts that are used to conduct current out of the solar cell. The conversion process involves the absorption of light rays by what can be referred to as the active region of the solar cell, which can excite electrons in the substrate into a higher state of energy. The excitation allows the electrons to move as an electric current that can then be extracted to an external circuit and stored.

SUMMARY OF THE INVENTION

One embodiment includes a method for fabricating solar cells incorporating effectively transparent contacts, the method including providing a photoabsorbing surface, providing a mold stamp, wherein one of the surfaces of the mold stamp defines a plurality of grooves, and forming effectively transparent contacts on the photoabsorbing surface using the mold stamp.

In another embodiment, the photo-absorbing surface includes metal contacts, the plurality of grooves includes parallel grooves having a periodicity matching the periodicity of the metal contacts, and the effectively transparent contacts are formed on top of the metal contacts.

In a further embodiment, the effectively transparent contacts are formed by depositing conductive ink onto the metal contacts, placing the mold stamp in contact with the photosbsorbing surface such that the conductive ink fills the hollow channels formed by the plurality of grooves and the photoabsorbing surface, curing the conductive ink, and removing the mold stamp such that the cured conductive ink remains on the metal contacts.

In still another embodiment, the photo-absorbing surface includes metal contacts in a branching pattern, wherein the width of the metal contact reduces after each branching fork, the plurality of grooves includes grooves matching the pattern of the metal contacts, and the effectively transparent contacts are formed on top of the metal contacts.

In a still further embodiment, the effective transparent contacts are formed by filling the plurality of grooves with conductive ink, placing the mold stamp in contact with the photosbsorbing surface such that the side of the mold stamp with the filled plurality of grooves is adjacent with the photoabsorbing surface, curing the conductive ink, and removing the mold stamp such that the cured conductive ink remains on the photoabsorbing surface.

In yet another embodiment, the effective transparent contacts are formed by placing the mold stamp in contact with the photosbsorbing surface such that the side of the mold stamp with the plurality of grooves is adjacent with the photoabsorbing surface, filling the volume created by the plurality of grooves and the photoabsorbing surface with conductive ink, curing the conductive ink, and removing the mold stamp such that the cured conductive ink remains on the photoabsorbing surface.

In a yet further embodiment, forming the effectively transparent metal contacts further includes annealing the cured conductive ink after the removal of the mold stamp from the photoabsorbing surface.

In another additional embodiment, the plurality of grooves is filled with conductive ink using capillary action.

In a further additional embodiment, forming the effectively transparent contacts further includes performing a selective surface treatment on the mold stamp to render the inside of the plurality of grooves hydrophilic.

In another embodiment again, the plurality of grooves is filled with conductive ink using a combination of capillary action and a pressure system.

In a further embodiment again, the pressure system applies positive pressure to fill the plurality of grooves with the conductive ink.

In still yet another embodiment, the conductive ink includes a silver nanoparticle ink.

In a still yet further embodiment, the conductive ink further includes glass particles.

In still another additional embodiment, curing the silver nanoparticle ink includes a process selected from the group consisting of: thermal curing, ultraviolet radiation, electromagnetic radiation tuned to the nanoparticles in the silver nanoparticle ink, and applying a current.

In a still further additional embodiment, the mold stamp includes a material selected from the group consisting of polydimethylsiloxane, polymethyl methacrylate, and ethylene-vinyl acetate.

In still another embodiment again, the plurality of grooves includes parallel triangular grooves.

In a still further embodiment again, at least one of the plurality of grooves has a depth-to-width ratio of at least 2-to-1.

In yet another additional embodiment, the photoabsorbing surface includes a textured surface, the mold stamp is made of polydimethylsiloxane, wherein the polydimethylsiloxane is formulated such that the elasticity of the polydimethylsiloxane compensates for the textured surface of the absorbing surface to promote adhesion between the mold stamp and the photoabsorbing surface.

In a yet further additional embodiment, the effectively transparent contacts are formed in an environment having a temperature of less than 21° C.

In yet another embodiment again, the mold stamp includes a gravure-printing roll.

Additional embodiments and features are set forth in part in the description that follows, and in part will become apparent to those skilled in the art upon examination of the specification or may be learned by the practice of the invention. A further understanding of the nature and advantages of the present invention may be realized by reference to the remaining portions of the specification and the drawings, which forms a part of this disclosure.

BRIEF DESCRIPTION OF THE DRAWINGS

The description will be more fully understood with reference to the following figures and data graphs, which are presented as exemplary embodiments of the invention and should not be construed as a complete recitation of the scope of the invention.

FIGS. 7A-7C conceptually illustrate a process for fabricating ETCs on top of existing contacts of a solar cell in accordance with an embodiment of the invention.

DETAILED DESCRIPTION

Figure 1:
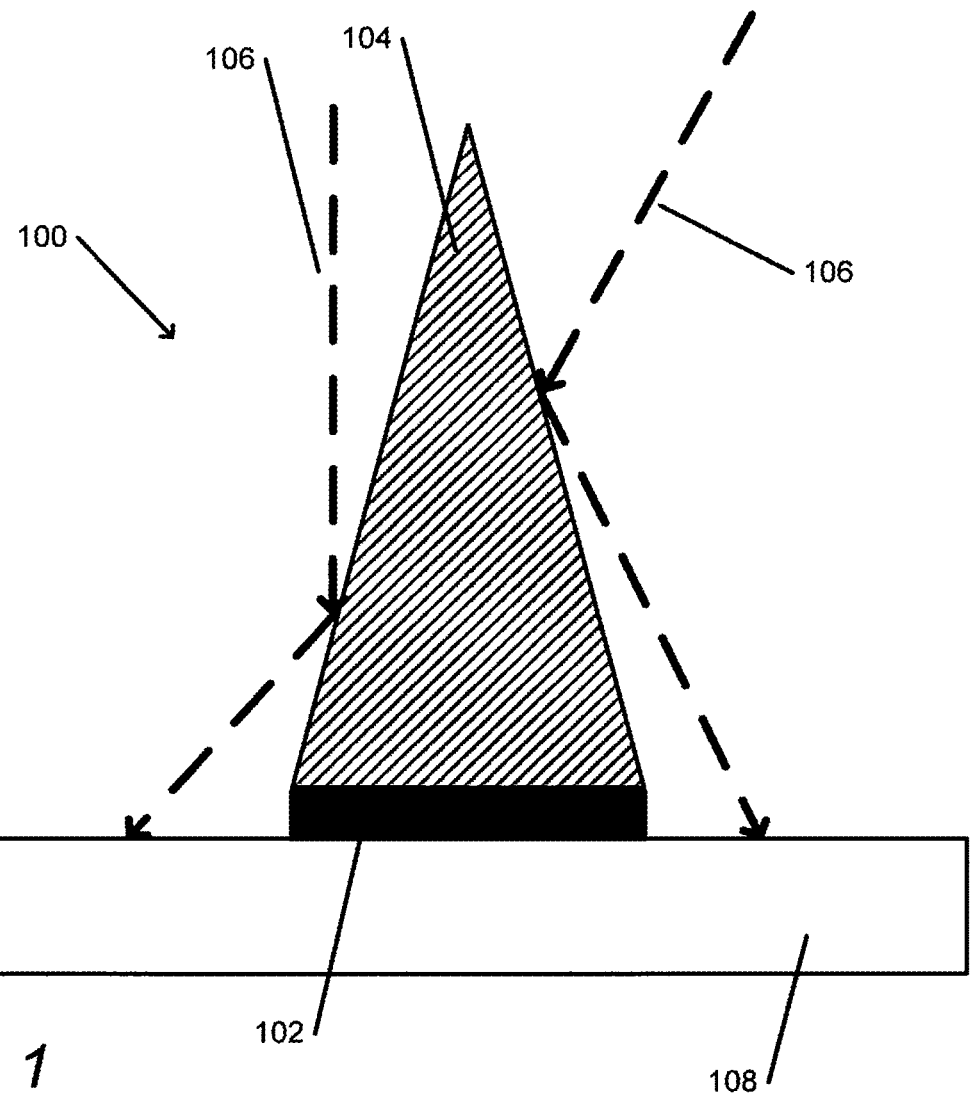
FIG. 1 conceptually illustrates a profile view of a section of a solar cell with an effectively transparent contact on top of a standard planar contact in accordance with an embodiment of the invention.

Turning now to the drawings, solar cells incorporating effectively transparent contacts and methods for fabricating such structures in accordance with various embodiments of the invention are illustrated. In conventional solar cells with metal contacts, a non-negligible fraction of the incoming solar power is immediately lost either through absorption or reflection upon interaction with the contacts. Effectively transparent contacts ("ETCs") for solar cells can be referred to as three-dimensional contacts designed to redirect incoming light onto a photoabsorbing surface of a solar cell. In many embodiments, the ETCs have triangular cross-sections. Such ETCs can be placed on a photoabsorbing surface such that at least one of their sides forms an angle with the photoabsorbing surface. In this configuration, the ETCs can redirect incident light onto the photoabsorbing surface, mitigating or eliminating reflection loss when compared to solar cells with conventional contacts. When constructed in accordance with a number of embodiments of the invention, ETCs can be effectively transparent and highly conductive. The contacts can also be incorporated within most types of solar cells.

Solar cells incorporating ETCs can be fabricated in many different ways, including through large-scale manufacturing techniques. In many embodiments, the ETCs are fabricated on top of existing contacts on solar cells. In other embodiments, the ETCs replace conventional contacts on the solar cells. Fabrication of ETCs can include the use of a mold stamp containing a plurality of grooves having cross-sections corresponding to the desired ETC shapes and dimensions. In several embodiments, the mold stamp is placed against a solar cell such that the side of the mold stamp containing the plurality of grooves is adhered to the solar cell. The mold stamp can be filled with a material from which the ETCs will be formed. The specific type of material used can depend on the specific application. In some embodiments, the mold stamp is filled with a conductive ink or paste, such as but not limited to silver nanoparticle ink. Many different types of filling methods can be implemented. Furthermore, the filling process can occur before or after the placement of the mold stamp against the solar cell. The material can then be cured and dislodged from the mold stamp, forming ETCs. Solar cells and methods of constructing solar cells incorporating ETCs in accordance with various embodiments of the invention are discussed further below.

Effective Transparency

In conventional solar cells with planar contacts, a non-negligible fraction of the incoming solar power is immediately lost either through absorption or through reflection. In such solar cells, only photons incident on the active photoabsorbing surface are capable of conversion to an electric current. Approaches for mitigating solar cell front contact losses can include using less absorbing transparent conductive oxides, or less reflective metal contacts. Achieving improved transparency using these approaches typically results in reduced conductivity, which in turn leads to series resistance electrical losses in the solar cell.

Solar cells in accordance with many embodiments of the invention incorporate effectively transparent contacts. The contacts are effectively transparent in the sense that they are formed with three-dimensional ("3D") shapes that reflect or redirect incident photons onto the active photoabsorbing surface of the solar cell. ETCs can be implemented to overcome shadowing losses and parasitic absorption without significantly reducing the conductivity of the contacts relative to conventional planar grid fingers. A solar cell incorporating ETCs can be fabricated with the ETCs either on top of existing contacts or on the photoabsorbing surface. FIG. 1 conceptually illustrates a profile view of a section of a solar cell with an ETC on top of a standard planar contact in accordance with an embodiment of the invention. As shown, the solar cell 100 includes a planar contact 102 a triangular cross-section ETC 104 that is designed to redirect incident light 106 to an active photoabsorbing surface 108 of the solar cell. In this way, the triangular cross-section ETC can perform as effectively transparent.

Although triangular cross-section contacts are described above with reference to the solar cell illustrated in FIG. 1, any of a variety of ETCs having profiles that redirect incident radiation in a manner appropriate to the requirements of specific solar cell applications can be utilized in accordance with various embodiments of the invention. ETC designs and implementations are generally discussed in U.S. patent application Ser. No. 15/144,807, entitled "Solar Cells and Methods of Manufacturing Solar Cells Incorporating Effectively Transparent 3D Contacts," and U.S. patent application Ser. No. 15/453,867, entitled "Encapsulated Solar Cells that Incorporate Structures that Totally Internally Reflect Light Away from Front Contacts and Related Manufacturing Methods." The disclosures of U.S. patent application Ser. Nos. 15/144,807 and 15/453,867 are hereby incorporated by reference in their entireties.

Effectively Transparent Contact Designs

Effectively transparent contacts in accordance with various embodiments of the invention can be fabricated in a variety of shapes, sizes, and patterns. In certain embodiments, the triangular cross-sections can be equilateral triangles (having a base that is wider than the height of the triangle), isosceles triangles, right angle triangles, scalene triangles, or obtuse triangles. In various embodiments, the triangles are constructed to have heights that are greater than the base width of the triangles (i.e. the surface closest to the photoabsorbing surface has a width that is less than the height to which the triangle extends above the photoabsorbing surface). In many embodiments, a surface of the ETC has a parabolic shape. In other embodiments, any of a variety of surface shapes can be utilized that redirect light incident on the contacts onto the photoabsorbing surfaces of the solar cells.

ETCs can be fabricated with widely varying dimensions that can depend on the specific requirements of a given application. In many embodiments, the ETCs have triangular cross-sections with a height-to-base ratio of at least 2:1, where the base side sits parallel with respect to the surface of the solar cell. In further embodiments, the ETCs have a height-to-base ratio of at least 3:1. For example, in some embodiments, the ETCs are fabricated to be approximately 10 micrometers wide and approximately 30 micrometers high. As can readily be appreciated, the dimensions of the ETCs to be fabricated can depend on the specific requirements of a given application. Different fabrication processes can allow for different height-to-base ratios. Such differences in cross-sectional shapes and sizes can influence the effective transparency of the ETCs. Additionally, processes in accordance with various embodiments of the invention allow for the fabrication of ETCs having line widths of less than 10 micrometers.

A wide variety of ETC patterns can be implemented in accordance with various embodiments of the invention. In many embodiments, the ETCs are fabricated in a pattern that matches the pattern of existing contacts on a solar cell. In some embodiments, the ETCs are fabricated on the contact fingers of a solar cell in a parallel configuration of triangular prisms. ETCs can also be formed to have a tapered width and/or tapered height. By reducing the channel size, capillary forces can be enhanced. As will be discussed in the sections below, capillary forces can be used to aid the filling process in the fabrication of ETCs. In addition to enhancing the capillary forces, material use can be reduced. In a number of embodiments, an ETC having a triangular cross section is formed on the busbar of a solar cell. Busbar ETCs formed in accordance with various embodiments of the invention can have feature sizes of a few micrometers. Multiple triangular shaped busbars can be used to provide sufficient sheet resistance. In several embodiments, the sizes of the busbars are reduced to mesoscale in order to provide sufficient optical transparency and redirection of incoming light.

Figure 2:
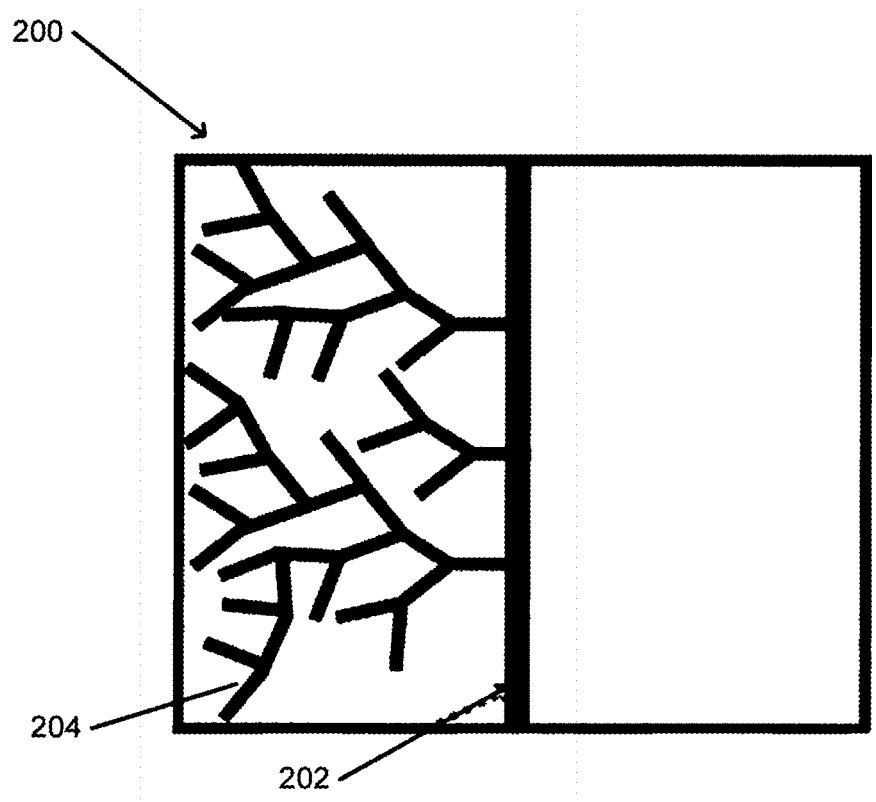
FIG. 2 conceptually illustrates a top view of a solar cell with contacts in a leaf pattern in accordance with an embodiment of the invention.

In a number of embodiments, the ETCs and existing contacts on the solar cell can be formed in a branching pattern. In further embodiments, the width of each groove or contact gets narrower as the branching gets deeper. Such a pattern can help facilitate the filling process through enhancement of capillary forces. In several embodiments, the branches are either perpendicular or parallel to one another. In other embodiments, the branching pattern is in a leaf pattern such that the branching angle can differ. In further embodiments, the branching angles are selected to enhance capillary forces. FIG. 2 conceptually illustrates a top view of a solar cell with contacts in a leaf pattern in accordance with an embodiment of the invention. As shown, the solar cell 200 includes a busbar 202 and a branching leaf pattern of fingers 204.

Although specific contact designs are discussed above, any of a variety of different contact shapes and patterns can be used to facilitate the redirection of incoming light and/or enhance the filling mechanisms, such as but not limited to increasing the capillary forces.

Fabrication Processes for Solar Cells Incorporating Effectively Transparent Contacts Solar cells incorporating ETCs can be fabricated in many different ways in accordance with various embodiments of the invention. A solar cell can incorporate ETCs by either fabricating the ETCs on top of existing planar contacts or on top of the photoabsorbing surface of a solar cell. Many fabrication processes include the use of a mold stamp having grooves with cross-sections corresponding to the desired ETC structures to be fabricated. Mold stamps in accordance with various embodiments of the invention can be made of various materials, such as but not limited to polydimethylsiloxane ("PDMS"), polymethyl methacrylate ("PMMA"), ethylene-vinyl acetate ("EVA"), and other suitable polymers. In many embodiments, the mold stamp is formed as a copy of a master mold. The master mold can be formed using various microfabrication techniques. In some embodiments, additive manufacturing techniques are utilized at the micro-scale to form the desired structures on the master mold. In other embodiments, selective etching techniques, such as but not limited to dry etching, can be used to form the master mold. A mold stamp can then be formed as a relief from the master mold using standard molding techniques.

In embodiments where the ETCs are fabricated on top of existing contacts, the fabrication process is introduced as a secondary metallization step in the overall fabrication process of the manufacturing of the solar cell. The secondary step can be integrated with existing processes for the manufacturing of solar cells. In a conventional solar cell, metal contacts can form an ohmic contact with the semiconductor metal below the contact. Once these contacts are formed, the secondary metallization step can be introduced to integrate aligned ETCs on top of the existing metal contacts to mitigate shading losses and improve electrical conductivity.

Figure 3:
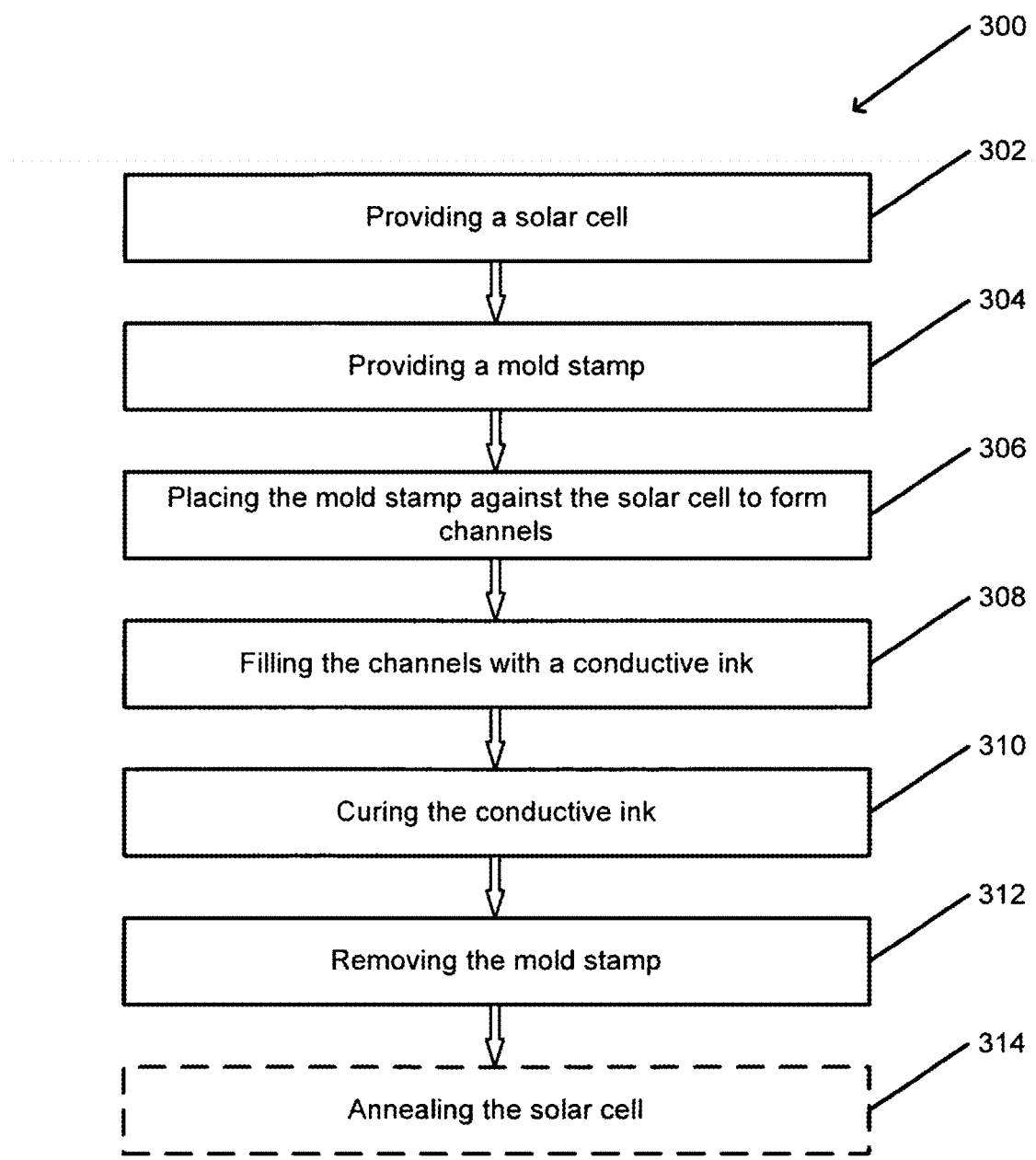
FIG. 3 conceptually illustrates a manufacturing process for fabricating effectively transparent contacts utilizing a mold stamp in accordance with an embodiment of the invention.

A manufacturing process for fabricating ETCs utilizing a mold stamp in accordance with an embodiment of the invention is conceptually illustrated in FIG. 3. The process 300 can include providing (302) a solar cell. In many embodiments, the solar cell contains existing planar contacts. Solar cells can be fabricated using conventional techniques known in the art. A mold stamp can be provided (304). Mold stamps in accordance with various embodiments of the invention can contain a pattern of grooves. In embodiments where the solar cell contains planar contacts, the grooves can be designed to have a periodicity that matches the periodicity of the existing planar contacts. Any of a number of methods for fabricating mold stamps, such as those described above, can be utilized.

The mold stamp can then be placed (306) onto the solar cell. In embodiments where the solar cell contains existing contacts, the mold stamp can be placed such that the grooves line up and are in contact with the planar contacts, forming a channel above each planar contact within which the conductive ink can fill. In many embodiments, the material of the mold stamp and the surface of the solar cell are adequate to promote sufficient adhesion such that the conductive ink would not leak out of the formed channels. In some embodiments, pressure can be applied to hold the mold stamp and solar cell together. In further embodiments, a clamping mechanism can be used to hold the mold stamp and solar cell together. Depending on the elasticity of the mold stamp and the structural integrity of the solar cell, the pressure can be adjusted accordingly to prevent damaging the solar cell.

In many embodiments, the solar cell contains a textured surface. In such embodiments, the mold stamp can be fabricated to have an elasticity and softness that help the stamp adhere to the textured surface. For example, the elasticity and softness of PDMS mold stamps can be adjusted during the fabrication process by adjusting the PDMS base to curing agent ratio. In a number of embodiments, the PDMS formulations include base to curing agent weight ratios ranging from 5:1 to 25:1. As can readily be appreciated, the specific base to curing agent weight ratio utilized can depend on the degree of the textured surface of the solar cell. Typically, more textured surfaces can require softer mold stamps. In some embodiments, the textured surface contains features with peak-to-peak distances of at least two micrometers. In such embodiments, a 25:1 base to curing agent ratio of PDMS can be used to form a soft mold stamp that can adhere to the textured surface.

Figure 4A:
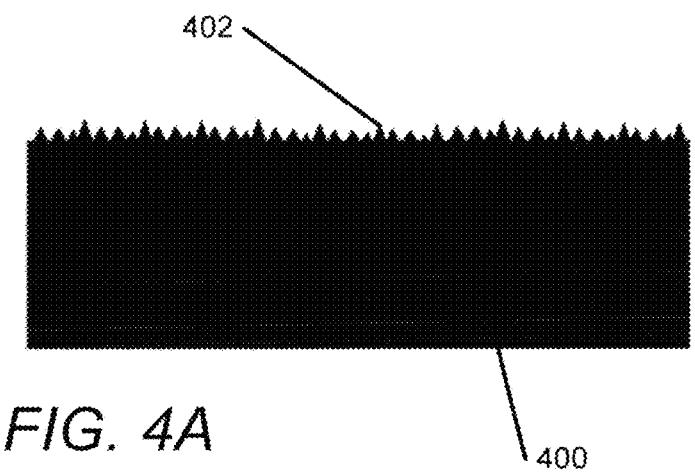
FIGS. 4A and 4B conceptually illustrate the adhesion of a mold stamp to a textured surface of a solar cell in accordance with an embodiment of the invention.
Figure 4B:
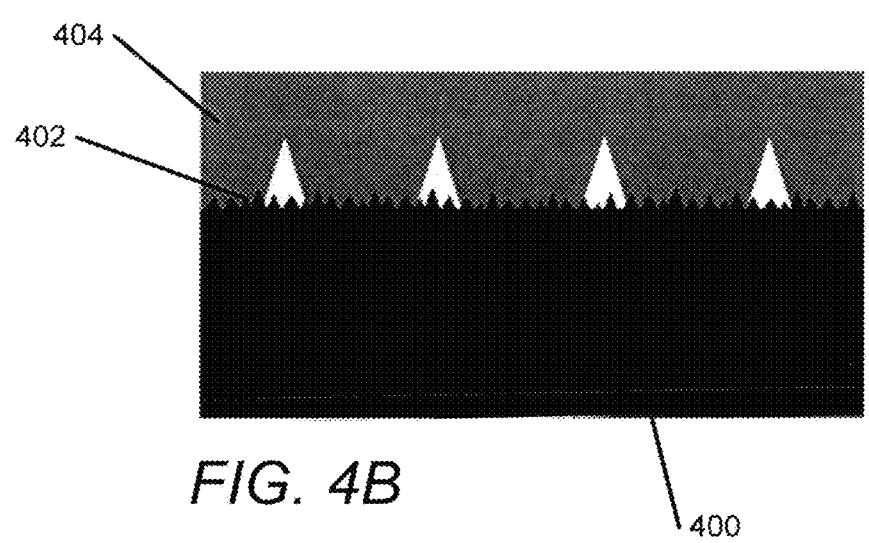

FIGS. 4A and 4B conceptually illustrate a mold stamp adhered to a textured surface of a solar cell in accordance with an embodiment of the invention. As shown, the solar cell 400 contains a textured surface 402. A PDMS mold stamp 404 can be formulated with a high elasticity such that adhesion to the textured surface 402 can be achieved.

The formed channels can be filled (308) with the conductive ink. Many different types of conductive ink can be used to form ETCs in accordance with various embodiments of the invention. In many embodiments, silver nanoparticle ink is used to form the ETCs. In some embodiments, glass particles are added to the conductive ink mixture. In embodiments where the ETCs are formed on top of planar contacts, the glass particles within the conductive ink mixture can help promote adequate adhesion between the ETCs and the existing contacts.

Figure 5:
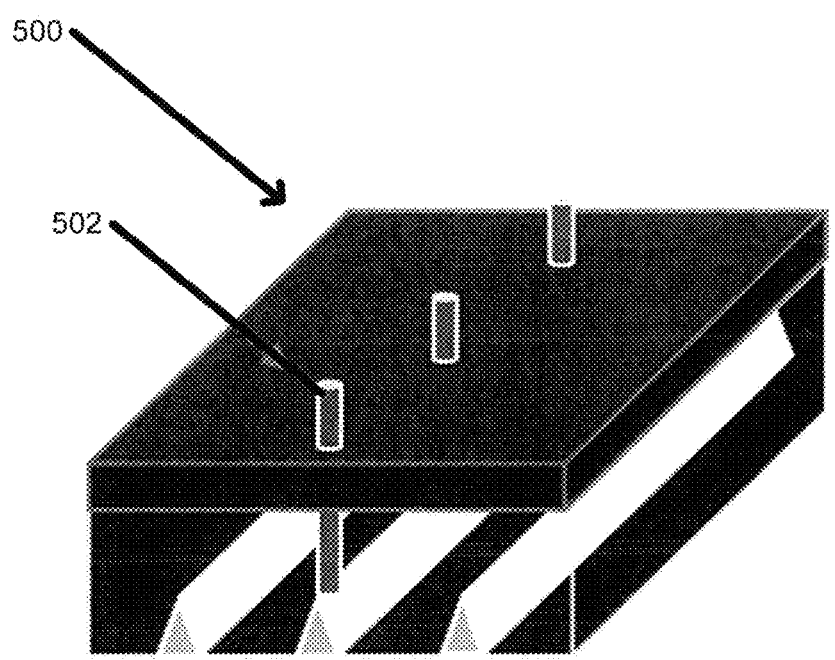
FIG. 5 conceptually illustrates a mold stamp containing an inlet microfluidic channel for the deposition of conductive ink in accordance with an embodiment of the invention.

Various methods can be applied to ensure that the conductive ink fills the channel as desired. In many embodiments, the small feature sizes of the channels allow for the channels to be filled with the conductive ink through capillary forces. In a number of embodiments, the mold stamp is tilted and gravity is used to fill the grooves with conductive ink. In several embodiments, the mold stamp contains at least one through-hole connected with the grooves through which the channels can be filled with conductive ink. FIG. 5 conceptually illustrates such a mold stamp. As shown, the mold stamp 500 includes an inlet microchannel 502 for ink deposition. In some embodiments, a pressure system is used to facilitate the infilling and/or enhance the capillary forces. The pressure provided by such an external system can be applied individually to each channel to promote homogeneous pressure profiles. The other side of the mold stamp can be opened to remove air from the channels. Either positive or negative pressure systems can be used for such processes. For example, in several embodiments, a vacuum system is used to facilitate the infilling.

Figure 6:
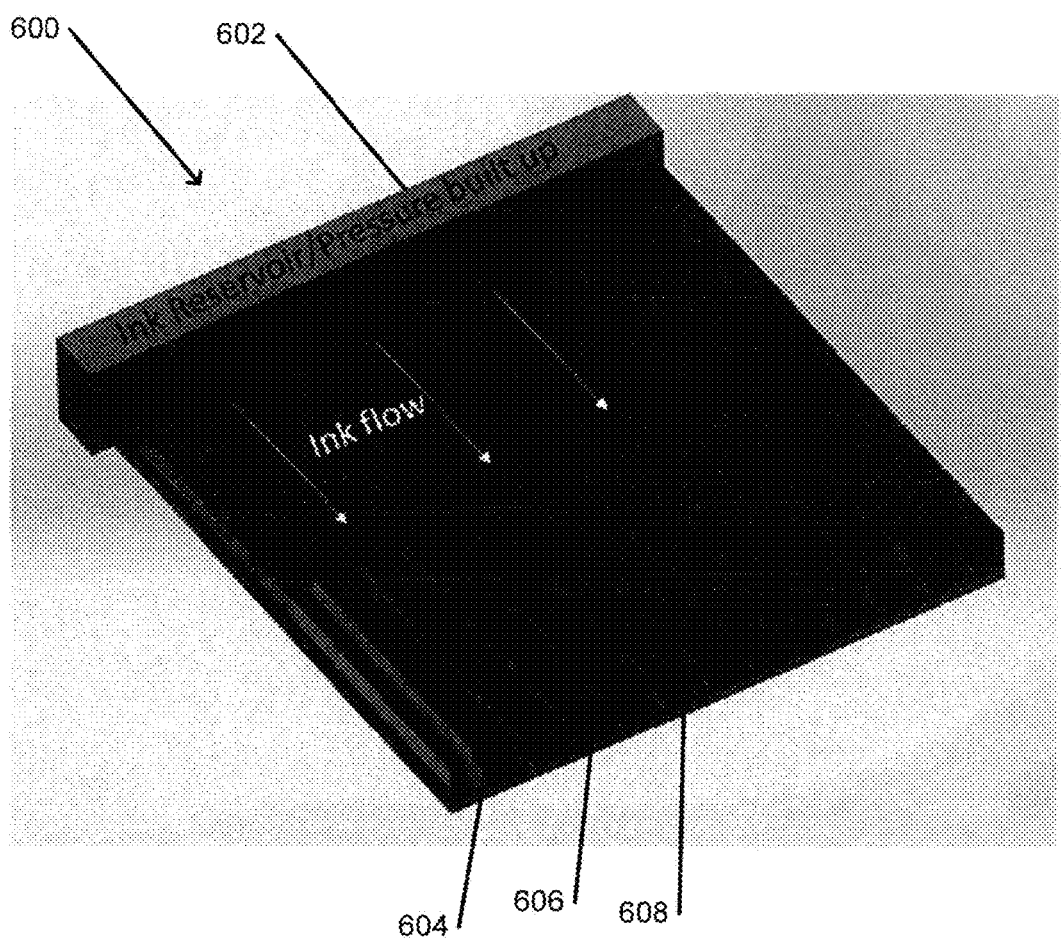
FIG. 6 conceptually illustrates a positive pressure system used to fill channels created from a mold stamp and a solar cell with a conductive ink in accordance with an embodiment of the invention.

FIG. 6 conceptually illustrates a positive pressure system used to fill channels created from a mold stamp and a solar cell with a conductive ink in accordance with an embodiment of the invention. As shown, the system 600 contains an ink reservoir/positive pressure system 602 capable of filling channels 604 formed by a mold stamp 606 and a solar cell 608. The ink reservoir/positive pressure system 602 injects ink in one side of the channels as air escapes out the opposite side.

In many embodiments, a selective surface treatment is performed on the mold stamp to change the surface energy of the treated surfaces. Such treatment can be performed to render the inside of the channel hydrophilic, which can enhance the capillary action. Surface treatments can include but are not limited to oxygen plasma treatment and isopropyl alcohol treatment.

The environmental conditions can affect whether the infilling process is successful. For example, by lowering the relative humidity, the capillary action can be boosted. As such, in many embodiments, the channels are filled in an environment with a relative humidity level of less than 20%. In some embodiments, the temperature of the environment is adjusted to enhance the capillary action. In further embodiments, the filling process takes place in an environment that is below room temperature, or below 21° C. Such conditions can be regulated by performing the process in a glove box where the conditions are more easily controlled. As can readily be appreciated, the specific environmental conditions can depend on the specific type of conductive ink utilized.

After the channels are adequately filled, the conductive ink can be cured (310). In many cases, the conductive ink is cured by removing solvents within the mixture. Depending on the type of conductive ink used, one or more appropriate curing processes are utilized. For example, curing processes for conductive ink containing nanoparticles can include but are not limited to electromagnetic radiation of a certain wavelength that is resonant with the nanoparticles, creating heat. Other curing processes can include but are not limited to the application of heat, ultraviolet radiation, and the application of a current. The degree of these curing processes can also depend on the specific conductive ink used. In some embodiments, thermal curing is performed on the conductive ink at temperatures of at least 100° C. in order to remove the solvents within the conductive ink.

After the curing process, the mold stamp can be removed (312), leaving behind the cured conductive ink, or formed ETCs, on top of the planar contacts. The formed ETCs can optionally be annealed (314) to reduce the individual ETCs gridline resistance. In many embodiments, the annealing step is performed at a higher temperature than a typically thermal curing process in accordance with various embodiments of the invention.

FIGS. 7A-7C conceptually illustrate a process for fabricating ETCs on top of existing contacts of a solar cell in accordance with an embodiment of the invention. As shown, the process includes utilizing an alignment system 700 for aligning and placing a mold stamp 702 on top of a solar cell 704 having existing planar contacts 706. Once placed, the mold stamp 702 forms channels 708 with the solar cell 704, which are then filled using a microfluidic dispenser 710 (FIG. 7B). A heater 712 is used to heat the solar cell 704, which applies thermal energy to the adjacent conductive ink in order to remove solvents from the ink. The mold stamp 702 is then removed, leaving behind ETCs 714 (FIG. 7C).

Although FIGS. 3 and 7A-7C illustrate a specific class of processes for fabricating ETCs, any of a number of different methods can be utilized. For example, in many embodiments, the grooves of a mold stamp are filled with a conductive ink before the stamp is placed against the solar cell. The filling process can include any of the processes described above, such as but not limited to the use of capillary forces. In some embodiments, a dispensing system is utilized to fill the grooves. The dispensing system can include one or more nozzles configured to deposit the conductive ink. In further embodiments, each individual nozzle is configured to contemporaneously move along and infill over the length of a groove. In several embodiments, the dispensing system is stationary while the mold stamp travels. In other embodiments, the dispensing system continuously deposits the conductive ink at a certain point along the length of the groove until the groove is filled. As the system deposits the ink, capillary action can cause the deposited ink to fill the length of the groove. In further embodiments, the mold stamp is made of an elastomer material and can be stretched, bent, and/or twisted to alter the cross-sectional shape of the grooves. Such contortions of the shape can facilitate the infilling process.

Figure 8A:
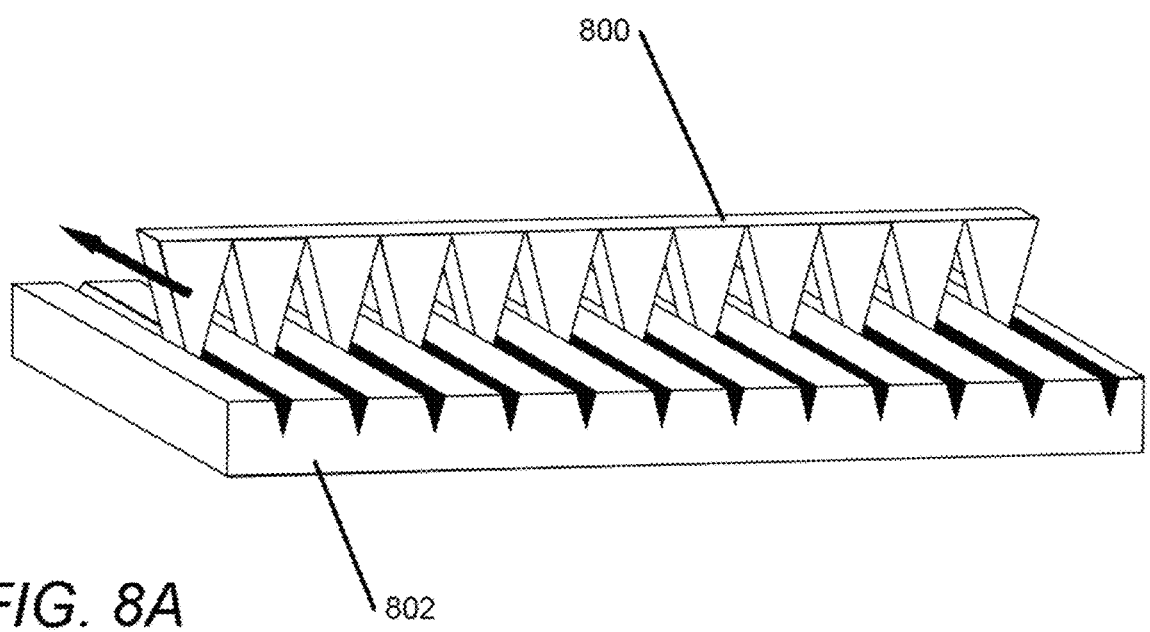
FIGS. 8A and 8B conceptually illustrate a process for fabricating ETCs by filling a mold stamp with conductive ink prior to placement on a solar cell in accordance with an embodiment of the invention.
Figure 8B:
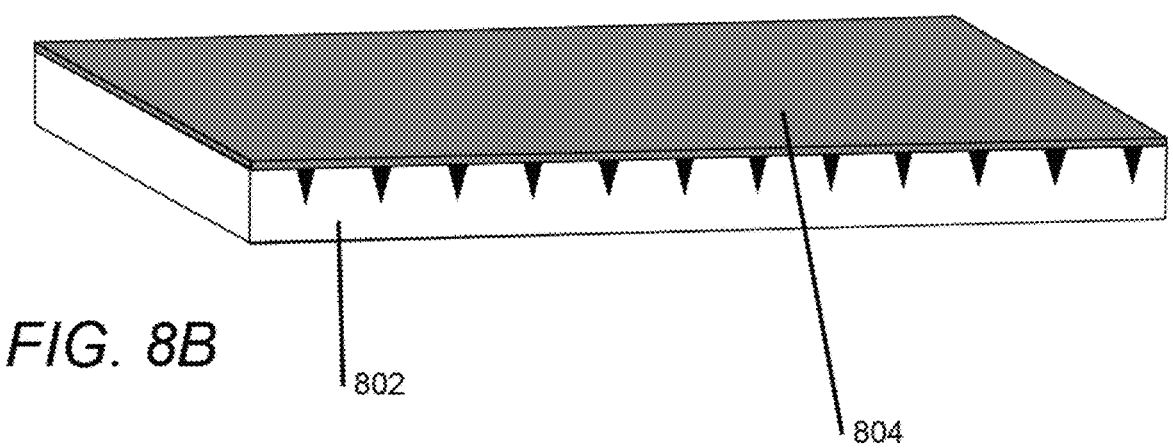

FIGS. 8A and 8B conceptually illustrate a process for fabricating ETCs by filling a mold stamp with conductive ink prior to placement on a solar cell in accordance with an embodiment of the invention. As shown, a system of ink nozzles 800 is used to fill a mold stamp 802 with conductive ink. FIG. 8B shows that a solar cell 804 can then be placed above the mold stamp 802 such that the conductive ink is in contact with the solar cell 804. A curing process can then be applied, and the mold stamp 802 can be removed to leave behind formed ETCs.

Another class of processes for fabricating ETCs includes a direct deposition step. In such embodiments, conductive ink can be deposited directly onto the planar contacts. Given the typical scale of the ETC structures, only a small amount of conductive ink is usually required to be deposited. In many embodiments, the conductive ink is deposited as micro-droplets onto the busbar of the solar cell. In other embodiments, the conductive ink is deposited next to the active area of the solar cell. A mold stamp can then be aligned and placed against the solar cell with the groove side against the existing contacts. The grooves can trap the conductive ink micro-droplets, and capillary forces can cause the ink to fill the channels formed by the grooves and existing contacts. In a number of embodiments, the process includes moving the mold stamp to form ETCs across a large area. In several embodiments, multiple mold stamps are used to form ETCs across a large area. The fabrication process can then proceed similarly as the processes described above.

In some embodiments, surface functionalization can be performed on the solar cells such that the ink accumulates at a desired position. For example, the contact grid can be treated to be hydrophilic while the areas in between are configured to be hydrophobic. In further embodiments, vibrations can be applied to the solar cell to aid movement of ink droplets to the desired areas. In a number of embodiments, gas pressure, such as but not limited to the use of an inert gas, can be used to blow any ink droplets to a desired state.

Figures 9A, 9B, 9C:
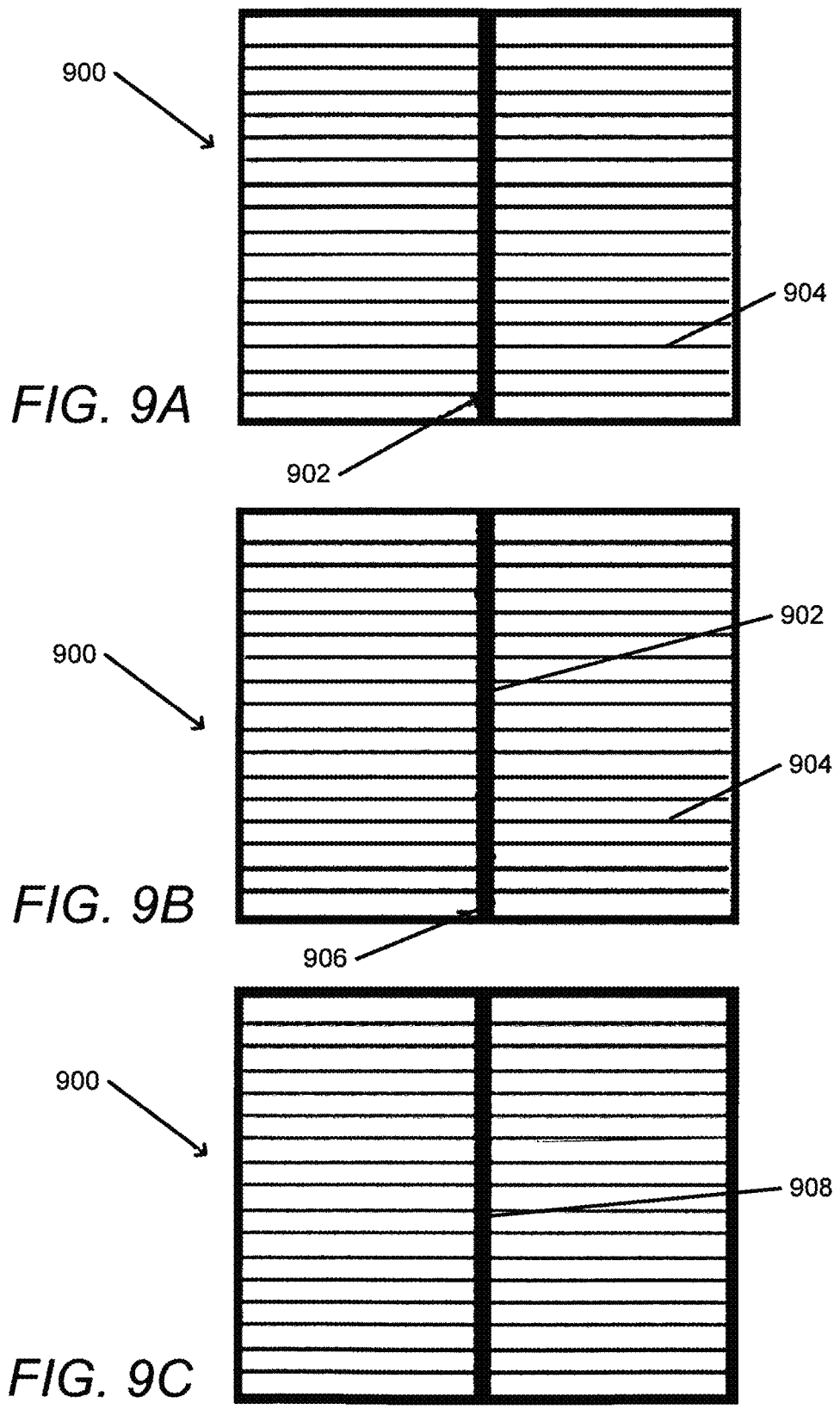
FIGS. 9A-9C conceptually illustrate a process for fabricating ETCs by depositing conductive ink directly onto contacts of a solar cell prior to placement of a mold stamp in accordance with an embodiment of the invention.

FIGS. 9A-9C conceptually illustrate a process for fabricating ETCs by depositing conductive ink directly onto contacts of a solar cell prior to placement of a mold stamp in accordance with an embodiment of the invention. FIG. 9A shows a top view of a solar cell 900 having a busbar 902 and contact fingers 904. Micro-droplets of conductive ink 906 can be deposited on the busbar 902 (FIG. 9B). A mold stamp can then be placed against the solar cell 900. Through the mechanisms such as those described above, the deposited ink fills the channels created by the mold stamp. Once a curing process is applied and the mold stamp is removed, a pattern of conductive ink 908 remains on top of the busbar 902 and contact fingers 904.

In some embodiments, a sacrificial layer is applied onto the solar cell. ETCs can be deposited using any of the methods mentioned above. In such embodiments, selective filling of the mold stamp within the grooves is not needed as the sacrificial layer can be etched away to remove residues between the ETCs.

In many embodiments, a gravure printing process is utilized to form ETCs. In such embodiments, the mold stamp is essentially a gravure-printing roll. The roll can include grooves with dimensions corresponding to the desired dimensions of the ETCs to be formed. In a number of embodiments, the grooves are spaced to match existing contacts on the solar cell. During the fabrication process, the grooves can be filled or selectively filled with conductive ink, such as but not limited to silver nanoparticle ink. Filling mechanisms such as those described above can be applied. For example, conductive ink can be deposited onto a small local area of a groove on the gravure-printing roll. Once the gravure printing roll moves across the solar cell, the small cross sections created by the grooves and existing contacts can cause capillary forces to facilitate the infilling of the channels. Alternatively, the conductive ink can be deposited onto the existing contacts of the solar cell. In some embodiments, the solar cell is heated such that when the ink-filled grooves come into contact with the surface of the solar cell, solvent within the ink can be removed. Thus, the ink will be deposited as the gravure printing roll rolls across the solar cell. In several embodiments, the gravure-printing roll can be heated to facilitate the solvent removal process to allow for better deposition. In some embodiments, ultraviolet-curing ink is used. As the gravure printing roll moves over the solar cell, ultraviolet light can be used to cure the ink such that the ink will be deposited onto the solar cell.

Figure 10:
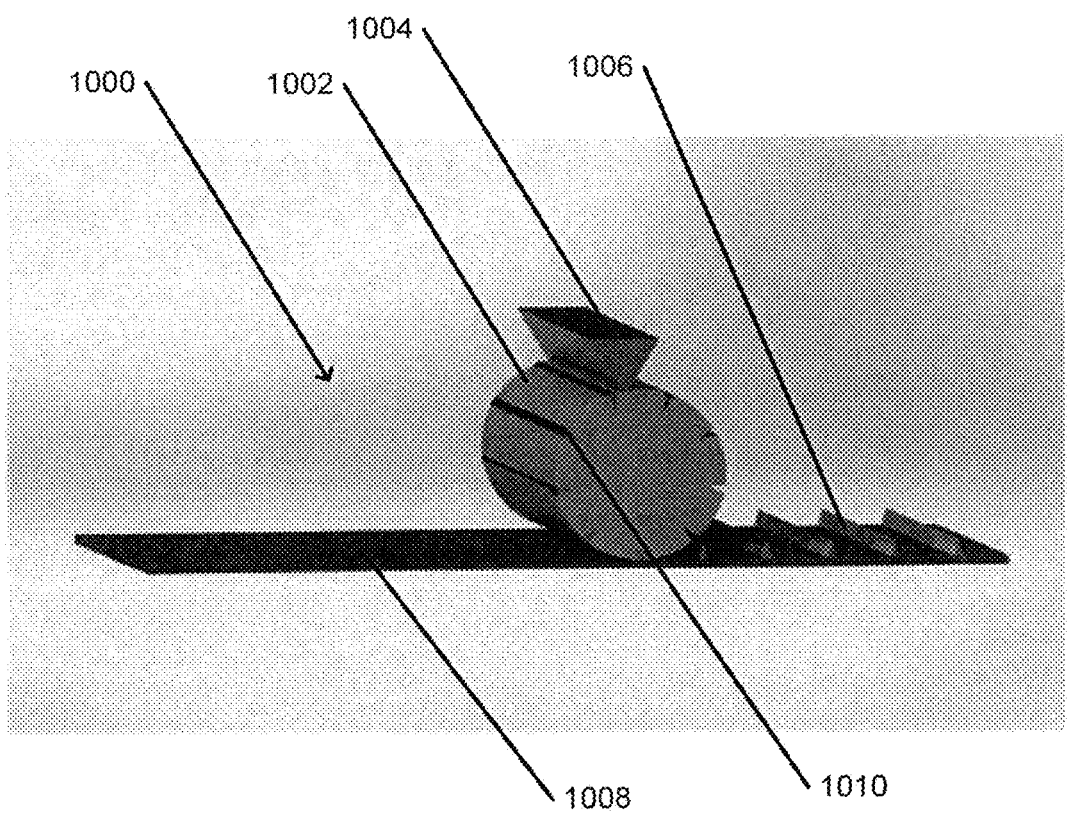
FIG. 10 conceptually illustrates a gravure printing process in accordance with an embodiment of the invention.

FIG. 10 conceptually illustrates a gravure printing process in accordance with an embodiment of the invention. As shown, the process 1000 utilizes a gravure-printing roll 902 and a dispensing nozzle 1004 to form a pattern of ETCs 1006 on a solar cell 1008. As the gravure printing roll 1002 rolls across the solar cell 1008, the dispensing nozzle 1004 is configured to fill in one or more of the grooves 1010 of the gravure-printing roll 1002. Contemporaneously, using a curing mechanism such as those described above, the conductive ink within a filled groove can be deposited onto the solar cell 1008 to form an ETC 1006.

While the above description contains many specific embodiments of the invention, these should not be construed as limitations on the scope of the invention, but rather as an example of one embodiment thereof. It is therefore to be understood that the present invention may be practiced in ways other than specifically described, without departing from the scope and spirit of the present invention. Thus, embodiments of the present invention should be considered in all respects as illustrative and not restrictive. Accordingly, the scope of the invention should be determined not by the embodiments illustrated, but by the appended claims and their equivalents.

What is claimed is:

1. A method for fabricating solar cells incorporating effectively transparent contacts, the method comprising:
   providing a photoabsorbing surface;
   providing a mold stamp, wherein one of the surfaces of the mold stamp defines a plurality of grooves having triangular cross sections;
   placing the mold stamp in contact with the photoabsorbing surface;
   depositing conductive ink; and
   forming effectively transparent contacts on the photoabsorbing surface using the mold stamp, wherein the effectively transparent contacts are triangular prisms, and wherein the effectively transparent contacts are configured to redirect incident photons onto the photoabsorbing surface.

2. The method of claim 1, wherein:
   the photoabsorbing surface comprises metal contacts;
   the plurality of grooves comprises grooves having a periodicity matching the periodicity of the metal contacts; and
   the effectively transparent contacts are formed on top of the metal contacts.

3. The method of claim 1, wherein the effectively transparent contacts are formed by:
   curing the deposited conductive ink; and
   removing the mold stamp such that the cured conductive ink remains on the photoabsorbing surface.

4. The method of claim 1, wherein:
   the photoabsorbing surface comprises metal contacts in a branching pattern, wherein the width of the metal contact reduces after each branching fork;
   the plurality of grooves comprises grooves matching the pattern of the metal contacts; and
   the effectively transparent contacts are formed on top of the metal contacts.

5. The method of claim 1, wherein the conductive ink is deposited into the plurality of grooves before the mold stamp is placed in contact with the photoabsorbing surface.

6. The method of claim 1, wherein the effective transparent contacts are tapered triangular prisms.

7. The method of claim 6, wherein forming the effectively transparent metal contacts further comprises annealing the cured conductive ink after the removal of the mold stamp from the photoabsorbing surface.

8. The method of claim 6, wherein the plurality of grooves is filled with conductive ink using capillary action.

9. The method of claim 6, wherein forming the effectively transparent contacts further comprises performing a selective surface treatment on the mold stamp to render the inside of the plurality of grooves hydrophilic.

10. The method of claim 6, wherein the plurality of grooves is filled with conductive ink using a combination of capillary action and a pressure system.

11. The method of claim 10, wherein the pressure system applies positive pressure to fill the plurality of grooves with the conductive ink.

12. The method of claim 6, wherein the conductive ink comprises a silver nanoparticle ink.

13. The method of claim 12, wherein the conductive ink further comprises glass particles.

14. The method of claim 12, wherein curing the silver nanoparticle ink comprises a process selected from the group consisting of: thermal curing, ultraviolet radiation, electromagnetic radiation tuned to the nanoparticles in the silver nanoparticle ink, and applying a current.

15. The method of claim 1, wherein the mold stamp comprises a material selected from the group consisting of polydimethylsiloxane, polymethyl methacrylate, and ethylene-vinyl acetate.

16. The method of claim 1, wherein the plurality of grooves comprises parallel or perpendicular triangular grooves.

17. The method of claim 2, wherein at least one of the effectively transparent contacts has a height-to-width ratio of at least 2-to-1.

18. The method of claim 1, wherein:
   the photoabsorbing surface comprises a textured surface;
   the mold stamp is made of polydimethylsiloxane, wherein the polydimethylsiloxane is formulated such that the elasticity of the polydimethylsiloxane compensates for the textured surface of the absorbing surface to promote adhesion between the mold stamp and the photoabsorbing surface.

19. The method of claim 1, wherein the effectively transparent contacts are formed in an environment having a temperature of less than 21° C.

20. The method of claim 1, wherein the mold stamp comprises a gravure printing roll.

* * * * *